United States Patent [19]

Shinriki et al.

[11] Patent Number: 4,937,650
[45] Date of Patent: Jun. 26, 1990

[54] SEMICONDUCTOR CAPACITOR DEVICE WITH DUAL DIELECTRIC

[75] Inventors: Hiroshi Shinriki, Tokyo; Yasushiro Nishioka, Tokyo; Noriyuki Sakuma, Hachioji; Kiichiro Mukai, Hachioji, all of Japan

[73] Assignee: Hitachi, Ltd., Tokyo, Japan

[21] Appl. No.: 247,343

[22] Filed: Sep. 21, 1988

Related U.S. Application Data

[63] Continuation of Ser. No. 936,603, Dec. 1, 1986, abandoned.

[30] Foreign Application Priority Data

Nov. 29, 1985 [JP] Japan .................................. 60-267113

[51] Int. Cl.$^5$ ...................... H01L 29/78; H01L 27/02
[52] U.S. Cl. .......................................... 357/51; 357/54; 357/23.6
[58] Field of Search ........................... 357/23.6, 51, 54

[56] References Cited

U.S. PATENT DOCUMENTS 4,495,219  1/1985  Kato et al. ......................... 357/51
4,589,056  5/1986  Stimmell ............................ 357/51
4,636,833  1/1987  Nishioka ............................ 357/51

FOREIGN PATENT DOCUMENTS 0046868  3/1982  European Pat. Off. ............. 357/51

Primary Examiner—Jerome Jackson, Jr.
Attorney, Agent, or Firm—Antonelli, Terry, Stout & Kraus

[57] ABSTRACT

A semiconductor device having a large-capacitance capacitor in which an insulator film is formed underneath a film made of a material having a high dielectric constant, such as tantalum oxide, in such a manner that a portion of the insulator film underneath a defect region which is undesirably thin is thicker than other portions of the insulator film, thereby preventing occurrence of a failure in terms of dielectric strength and deterioration of the lifetime of the capacitor which would otherwise be caused by the existence of the defect region. Also disclosed is a process for producing such semiconductor device. Thus, it is possible to effectively prevent occurrence of problems which would otherwise be caused when a material having a high dielectric constant, such as tantalum oxide, is employed as a dielectric film of a capacitor, so that the reliability of a semiconductor having a large-capacitance capacitor is greatly improved.

18 Claims, 5 Drawing Sheets

SEMICONDUCTOR CAPACITOR DEVICE WITH DUAL DIELECTRIC

This application is a continuation application of application Ser. No. 936,603, filed Dec. 1, 1986 now abandoned.

BACKGROUND OF THE INVENTION

The present invention relates to a semiconductor device and a process for producing the same. More particularly, the present invention pertains to a semiconductor device having a capacitor of large capacitance and high reliability and a process for producing such semiconductor device.

As is well known, one type of capacitor in which a silicon dioxide film is used as an insulator film is widely employed in various kinds of semiconductor memory.

As the packing density of semiconductor integrated circuits increases, the area for capacitors becomes considerably small. A reduction in the area for capacitors decreases capacitance, and this leads to a lowering in reliability of the semiconductor memory. For this reason, a means has already been proposed in which an oxide of a transition metal having a relatively large dielectric constant, e.g., $Ta_2O_5$, is employed as a dielectric film of a capacitor in order to prevent lowering of capacitance.

For example, Japanese Patent Laid-Open No. 4152/1984 discloses a method wherein, after a tantalum oxide ($Ta_2O_5$) film has been formed on a silicon substrate, a heat treatment is carried out in a wet oxidizing atmosphere to grow a silicon dioxide film at the interface between the tantalum oxide film and the silicon substrate, and then an upper electrode made of a refractory metal or a silicide of a refractory metal is formed on the tantalum oxide film to produce a capacitor.

However, the examination made by the inventor of this application has found that the capacitor produced by the above-described conventional method is unfavorably inferior in terms of long-term reliability, and the thickness of the silicon dioxide film formed between the tantalum oxide film and the silicon substrate is undesirably increased to lower the capacitance, thus considerably deteriorating effectiveness which is offered by employment of tantalum oxide as a dielectric film.

More specifically, although the above-described prior art has the advantage that formation of a silicon dioxide film between a silicon substrate and a tantalum oxide film enables a reduction in the defect density of the tantalum oxide film and consequently permits an improvement in dielectric strength, the capacitance per unit area is extremely decreased. Further, when the thickness of the silicon dioxide film exceeds 40 Å, it is impossible for the capacitor to obtain a long-term reliability which is superior to that of the silicon dioxide film since the degradation in dielectric strength with time of the capacitor in the case where a predetermined voltage is applied thereto depends on the durability of the silicon dioxide film at the interface between the silicon substrate and the tantalum oxide film.

SUMMARY OF THE INVENTION

In view of the above-described problems of the prior art, it is an object of the present invention to provide a semiconductor device including a capacitor which has a reduced defect density, a satisfactorily high dielectric strength, an improved long-term reliability and a favorably large capacitance, and a process for producing such semiconductor device.

To this end, according to the present invention, after an oxide film of a transition metal has been formed on a silicon substrate or a lower electrode, a heat treatment is carried out in a dry oxidizing atmosphere to grow an oxide of the silicon substrate or an oxide of the lower electrode underneath a defect region of the oxide film of the transition metal in such a manner that the film thickness is greater at the defect region than that at other regions. In this way, a total film thickness of the defect region of the oxide film of the transition metal is increased by the existence of the oxide of the lower electrode, and lowering of the dielectric strength is thereby prevented.

DETAILED DESCRIPTION OF THE PREFERRED EMBODIMENTS

The present invention will be described hereinafter by way of one of the most typical examples thereof in which a silicon substrate and tantalum oxide ($Ta_2O_5$) are employed as a lower electrode and an oxide of a transition metal, respectively.

In a region which involves deterioration in dielectric strength of the interface between a silicon substrate and a tantalum oxide film, the thickness of the tantalum oxide film is smaller than that of other regions. According to the present invention, silicon dioxide is selectively grown at this defect region to increase the total film thickness, so that the dielectric strength is improved and it is possible to prevent deterioration in dielectric strength of the capacitor. On the other hand, according to the examination made by the present inventor, when the thickness of the silicon dioxide film exceeds 40 Å, the long-term reliability becomes lower than that in the case of a film thickness of 40 Å or less. For this reason, in regions other than the above-described defect region, the thickness of the silicon dioxide film at the interface between the silicon substrate and the tantalum oxide film is set at 40 Å or less lowering of the long-term reliability.

The silicon dioxide silicon film formed underneath a defect region partially has a thickness of 40 Å or more. In such case, however, since the silicon dioxide film is grown in such a manner that the defect region has a satisfactorily larger dielectric strength than that in regions other than the defect region, the long-term reliability is not inferior to that of the other regions, as described later. Further, since the thickness of the silicon dioxide film in the defect region is increased, the capacitance of this region is decreased. However, the area of the defect region is extremely small as compared with the total area of the capacitor. Accordingly, there is substantially no effect on the total capacitance of the capacitor, and the total capacitance is therefore substantially equal to the capacitance of regions other than the defect region. Since the silicon dioxide film formed in regions other than the defect region has a thickness of 40 Å or less, it is possible to realize an extremely large capacitance.

To form an $SiO_2$ film underneath the tantalum oxide film in such a manner that this portion of the $SiO_2$ is thicker than other portions thereof, it is necessary to carry out a heat treatment in a dry oxidizing atmosphere after the tantalum oxide film has been formed. If the heat treatment is carried out in a wet oxidizing atmosphere, a relatively thick $SiO_2$ film will be formed not only underneath the defect region but also the whole interface between the tantalum oxide film and the silicon substrate, which means that it is impossible to obtain a large capacitance.

Also, as the above-described lower electrode, a polycrystalline silicon film or a silicide film such as titanium silicide may be employed in addition to a silicon substrate.

It is also possible to attain the object of the present invention by employing titanium nitride or aluminum (or an aluminum-based alloy) and carrying out a heat treatment in a dry oxidizing atmosphere to form a titanium oxide film or an aluminum oxide film underneath a defect region of the tantalum oxide film in such a manner that the formed film is thicker at the defect region than at other regions, in a manner similar to that in the case of employing silicon.

Embodiment 1

Figure 1:
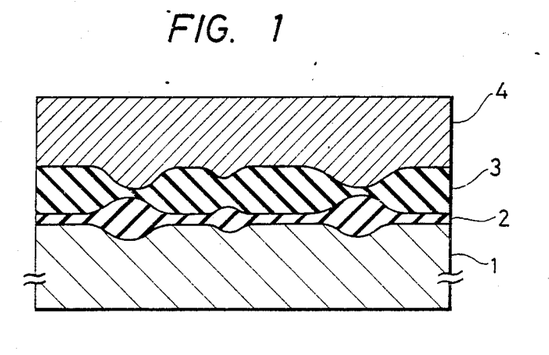
FIG. 1 is a sectional view employed to describe the arrangement of the present invention.

FIG. 1 is a sectional view of a capacitor formed in such a manner that, after a tantalum oxide film 3 has been formed on the surface of a silicon substrate 1, a heat treatment is carried out in a dry oxidizing atmosphere at 800° C. to 1000° C. to form a silicon dioxide film 2 at the interface between the tantalum oxide film 3 and the silicon substrate 1, and then a tungsten film 4 which serves as an upper electrode is deposited on the tantalum oxide film 3.

The thickness of the silicon dioxide film 2 formed at the interface between the silicon substrate 1 and the tantalum oxide film 3 depends on the thickness of the tantalum oxide film 3 and the temperature of the heat treatment carried out in a dry oxidizing atmosphere. The relationship therebetween will be explained below with reference to FIG. 3. In the graph shown in FIG. 3, the axis of abscissas represents the thickness of the tantalum oxide film 3 formed on the silicon substrate 1, and the axis of ordinates represents the thickness of the silicon dioxide film 2 formed by the heat treatment at the interface between the tantalum oxide film 3 and the silicon substrate 1. As will be clear from the graph, when the heat treatment temperature is 800° C., if the thickness of the tantalum oxide film 3 exceeds 10 nm, substantially no silicon dioxide is grown at the interface, but as the thickness of the tantalum oxide film 3 decreases below 10 nm, the thickness of the silicon dioxide film 2 increases. Similarly, when the heat treatment temperature is 1,000° C., the thickness of $SiO_2$ film which is formed underneath a tantalum oxide film having a thickness of about 10 nm or more is about 2 nm or less, but as the thickness of the tantalum oxide film decreases below 10 nm, the thickness of the $SiO_2$ film formed thereunder increases suddenly.

Accordingly, if, after a tantalum oxide film has been formed on a silicon substrate or a lower electrode, a heat treatment is carried out in a dry oxidizing atmosphere, an $SiO_2$ film 2 is formed in such a manner that the film 2 is relatively thick underneath defect regions (portions having relatively small film thicknesses) of the tantalum oxide film 3 but is relatively thin underneath normal regions (portions having relatively large thicknesses), as shown in FIG. 1. As a result, lowering of dielectric strength, which is caused by the fact that tantalum oxide film 3 is locally thin, is effectively prevented, and a capacitor of extremely high reliability is formed.

Figure 2:
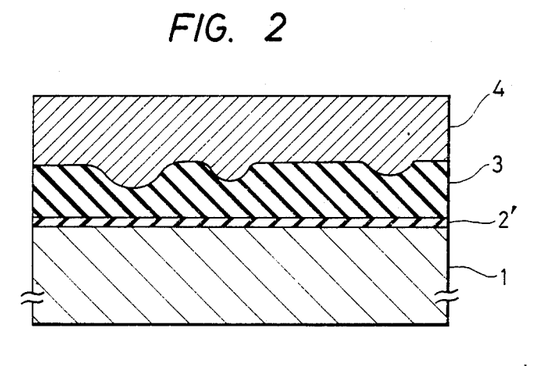
FIG. 2 is a sectional view showing the structure of an $SiO_2$ film produced when no heat treatment is carried out.

FIG. 2 shows a cross-sectional structure of a capacitor formed in such a manner that, after a tantalum oxide film has been formed, an upper electrode 4 is formed without carrying out a heat treatment such as that described above.

As will be clear from FIG. 2, if the above-described heat treatment is not carried out, a relatively thin $SiO_2$ film 2' which has a uniform thickness is formed. This $SiO_2$ film 2' is a natural oxide film of silicon, and it is slightly oxidized when a tantalum oxide film is formed by sputtering in an oxidizing atmosphere. Since the $SiO_2$ film 2' has a thickness of only about 1.5 nm, the laminate of dielectric films in each of the defect regions (portions in which the tantalum oxide film 3 has a relatively small thickness) has an unsatisfactorily small total thickness (the sum of the respective thicknesses of the tantalum oxide film 3 and the $SiO_2$ film 2'), and this constitutes a cause of deterioration of dielectric strength.

If the heat treatment, which is effected after the formation of a tantalum oxide film, is carried out in a wet oxidizing atmosphere, an exceedingly thick $SiO_2$ film will be formed not only underneath defect regions but also at the whole interface between the tantalum oxide film and the lower electrode, which means that it is impossible to obtain a large capacitance.

Accordingly, it is necessary to carry out a heat treatment in a dry oxidizing atmosphere after a tantalum oxide film has been formed, to form the $SiO_2$ film 2 partially differing in thickness between the tantalum oxide film 3 and the lower electrode 1 as shown in FIG. 1.

As described above, the tantalum oxide film 3 involves undesirably thin portions (defect regions) which are locally present therein, and therefore, if the $SiO_2$ film formed at the interface is relatively thin and uniform, the dielectric strength of each of the portions of the tantalum oxide film 3 which have relatively small thicknesses is lowered, and the reliability is degraded.

The feature of the present invention resides in that an $SiO_2$ film partially differing in thickness is formed at the interface between a tantalum oxide film and a lower electrode by a heat treatment which is carried out in a dry oxidizing atmosphere. In this case, the respective thicknesses of the tantalum oxide film and the $SiO_2$ film are essential to the present invention and therefore will be explained below in detail.

Figure 3:
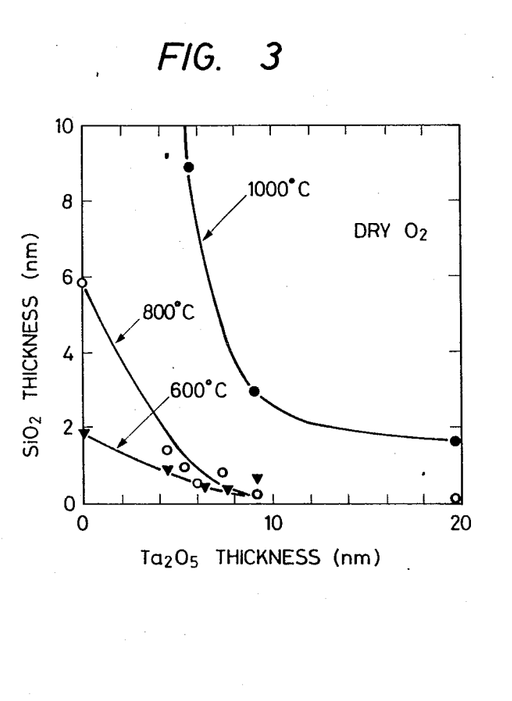
FIGS. 3 to 6 are views employed to explain advantageous effects offered by the present invention.

Referring to FIG. 2, a tantalum oxide film 3 having a thickness of 75 Å is formed on the lower electrode by carrying out a heat treatment at 800° C. for 30 minutes. As described above, the tantalum oxide film 3 formed on the surface of the silicon substrate 1, serving as a lower electrode, is not uniform in thickness and involves portions which are thinner than 75 Å. In this case, as shown in FIG. 3, an $SiO_2$ film having a thickness of about 0.5 nm is grown underneath the tantalum oxide film 3 having a thickness of 75 Å by the above-described heat treatment. Therefore, the total thickness of the $SiO_2$ film, including the $SiO_2$ film which has been formed before the above-described heat treatment, is about 2.0 nm. According to the present invention, a heat treatment is carried out after the tantalum oxide film has been formed. Effects produced by a heat treatment carried out in an oxidizing atmosphere will be explained below with reference to the graph shown in FIG. 4 wherein the axis of ordinates represents effective electric field and the axis of abscissas represents the thickness of tantalum oxide film. In this case, the effective electric field is a value obtained by dividing the voltage applied to the capacitor by a thickness of silicon dioxide film which is equal to the capacitance per unit area of a double layer film consisting of a tantalum oxide film and a silicon dioxide film, that is, electric field converted into the thickness of silicon dioxide. Referring to FIG. 2, in the case where the heat treatment according to the present invention is not carried out, when an effective electric field of 13 MV/cm is applied to a region in which the thickness of the tantalum oxide film 3 is 75 Å, an electric field higher than 13 MV/cm is undesirably applied to a region in which the thickness of the tantalum oxide film 3 is smaller than 75 Å. For example, an effective electric field of about 19 MV/cm is undesirably applied to a region in which the thickness of the tantalum oxide film 3 is 20 Å. On the other hand, in the case where a heat treatment is carried out in an oxidizing atmosphere at 800° C. for 30 minutes, when an effective electric field of 13 MV/cm is applied to a region in which the thickness of the tantalum oxide film is 75 Å, an effective electric field which is lower than 13 MV/cm is applied to a region in which the thickness of the tantalum oxide film is smaller than 75 Å. For example, as shown in FIG. 3, an $SiO_2$ film having a thickness of about 40 Å is grown by the above-described heat treatment in a region in which the thickness of the tantalum oxide film is 20 Å, and therefore the applied effective electric field is only about 8 MV/cm. Accordingly, effective dielectric strength is improved in a portion in which the tantalum oxide film is locally thinned.

Figure 5:
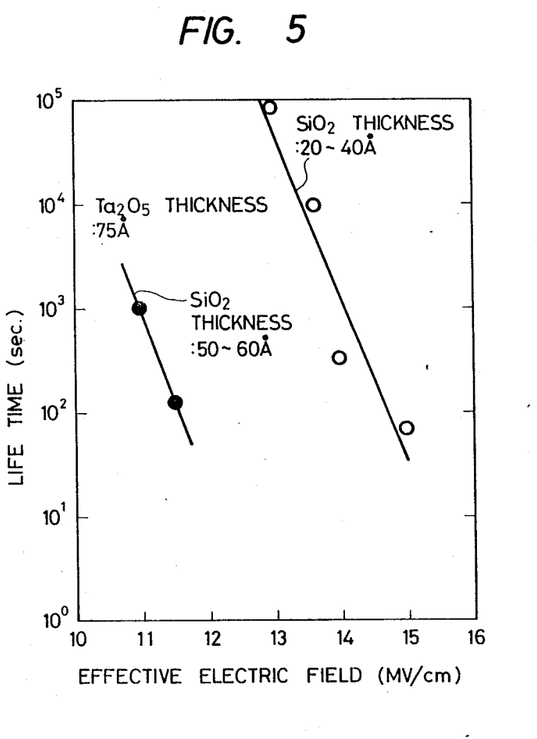

FIG. 5 shows results of measurement carried out as to the long-term reliability of a capacitor in which a dielectric film is defined by a double layer film consisting of a tantalum oxide film and a silicon dioxide film. FIG. 5 shows average lifetimes of capacitors measured by applying a predetermined electric field thereto. As will be clear from FIG. 5, capacitors in which the thickness of the silicon dioxide film formed at the interface between the tantalum oxide film and the silicon substrate exceeds 50 Å are readily broken down, whereas capacitors in which the thickness of the silicon dioxide film is 40 Å or less have much longer lifetimes than the former. Accordingly, in a capacitor in which a double layer film consisting of a tantalum oxide film and a silicon dioxide film is employed as a dielectric film, it is possible to obtain extremely favorable results by setting the thickness of the silicon dioxide film at 40 Å or less.

Figure 6:
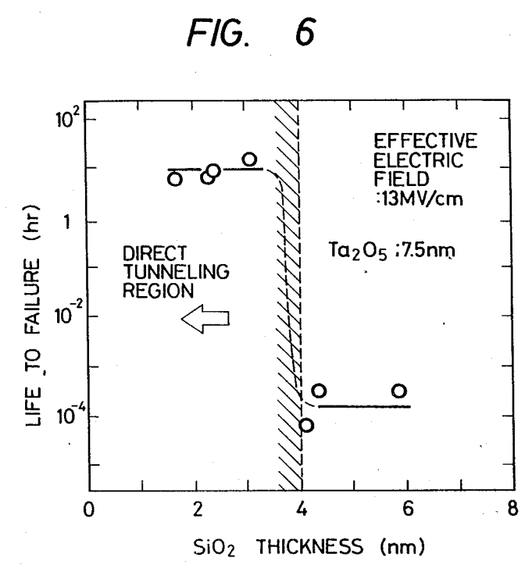

FIG. 6 shows results of measurement of the time to failure of capacitors in which a double layer film consisting of a tantalum oxide film of thickness 75 Å and a silicon dioxide film formed at the interface between a silicon substrate and the tantalum oxide film is employed as a dielectric film. In the measurement an effective electric field of 13 MV/cm was applied to such capacitors with the thickness of the silicon dioxide film varied within a range from 20 Å to 60 Å. As will be clear from FIG. 6, as the thickness of the silicon dioxide film decreases below 40 Å, the time to failure suddenly increases. This is because, as the thickness of the silicon dioxide film decreases, the electron conduction mechanism is allowed to include more direct tunneling components, so that it becomes difficult for the silicon dioxide film to be damaged and broken down. Similar results were obtained also in the case where the tantalum oxide film has a thickness other than 75 Å.

Accordingly, portions of the silicon dioxide film which are formed underneath regions of the tantalum oxide film other than defect regions preferably have a thickness of 40 Å or less.

Figure 4:
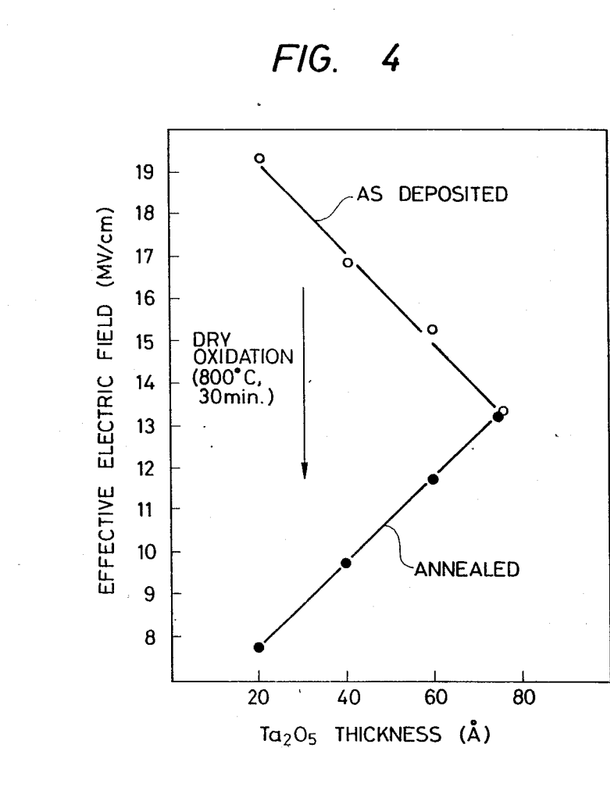

As shown in FIG. 4, in a region in which the thickness of the tantalum oxide film 3 is less than 40 Å, the thickness of the silicon dioxide film 2 formed at the interface between the tantalum oxide film 3 and the silicon substrate 1 exceeds 40 Å. However, the effective electric field applied to this region is less than 9.5 MV/cm, as will be clear from FIG. 4. In this case, the lifetime is longer than 105 seconds as shown in FIG. 5, which is not inferior to that of a region in which the thickness of the tantalum oxide film is 75 Å. Accordingly, even when a silicon dioxide film having a thickness of 40 Å or more is formed underneath a defect region of the tantalum oxide film, there is no fear of the dielectric strength and average lifetime being lowered. It has been found that similar advantageout effects are obtained with an oxide of Ti, Hf, Nb or Zr in addition to tantalum oxide.

Embodiment 2

This embodiment provides the example of a semiconductor device having a capacitor of excellent reliability in which the lower electrode is made of polycrystalline silicon and which can be formed on an isolation insulator film or an element region.

Figure 7:
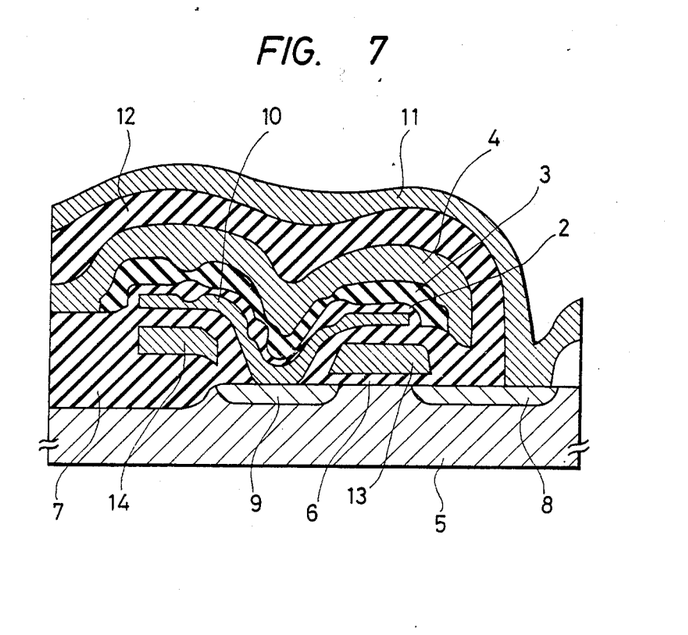
FIG. 7 is a sectional view showing one embodiment of the present invention.

FIG. 7 is a sectional view of a memory cell having a storage capacitor and a transfer transistor. In FIG. 7, the reference numeral 5 denotes a P-type silicon substrate, 6 a gate insulator film, 7 a field insulator film, 8, 9 n+regions defining a source and a drain, 10 a polycrystalline silicon film defining a first electrode (lower electrode) of the capacitor, 4 a tungsten electrode, 12 an intermediate insulator film, and 11 an aluminum wiring. In addition, numerals 13 and 14 respectively denote first and second word lines made of polycrystalline silicon. The aluminum wiring 11 defines a bit line. In the memory cell arranged as described above, the first electrode of the storage capacitor is defined by the polycrystalline silicon film 10 on which is formed a dielectric film defined by a double layer film consisting of a tantalum oxide film 3 and a silicon dioxide film 2. As shown in FIG. 7, the tantalum oxide film 3 is locally thinned, and portions of the silicon dioxide film 2 which are located underneath these thin regions of the film 3 are thicker than the other portions thereof. Portions of the silicon dioxide film 2 underneath regions of the tantalum oxide film 3 other than the thin regions have a thickness of 40 Å or less. The capacitor having the tungsten film 4 as its upper electrode shows characteristics equal to those of the capacitor in accordance with Embodiment 1 which is formed on the silicon substrate. As shown in FIG. 7, since the capacitor in accordance with this embodiment can be formed on the element region (transfer transistor) or the element isolating insulator film region (the thick SiO$_2$ film 7), it is extremely useful for producing a high-packing density memory.

Similar advantageous effects are also found using an oxide of Ti, Hf, Nb or Zr in addition to tantalum oxide.

Embodiment 3

Figure 8:
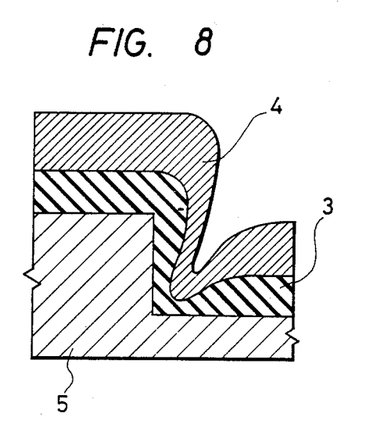
FIGS. 8 and 9 show in combination another embodiment.

Referring to FIG. 8, a tantalum oxide film 3 and an upper electrode 4 defined by a tungsten film are formed on a silicon substrate having a steep step on the surface thereof by a known sputtering method, thereby forming a capacitor. Thus, a portion of the tantalum oxide film 3 which is formed on the side of the step is smaller than a horizontal portion of the film 3 and therefore readily gives rise to a failure in terms of dielectric strength.

Figure 9:
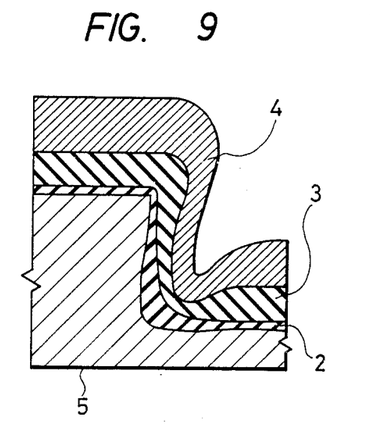

However, if, after the Ta$_2$O$_5$ film 3 has been formed at the step portion, annealing is effected in a dry oxidizing atmosphere at 900° C., an SiO$_2$ film 2 is formed at the interface between the Ta$_2$O$_5$ film 3 and the silicon substrate 5 in such a manner that a portion of the film 2 is thicker at the thin side portion of the Ta$_2$O$_5$ film 3 than underneath the horizontal portion of the film 3. Therefore, it is possible to prevent deterioration in dielectric strength of the Ta$_2$O$_5$ film 3 at the side portion thereof and consequently obtain a higher dielectric strength than that of the capacitor shown in FIG. 8. On the other hand, the portion of the SiO$_2$ film 2 which is formed at the interface between the horizontal portion of the Ta$_2$O$_5$ film 3 and the Si substrate 5 is extremely thin, so that the capacitance of the horizontal portion of the capacitor is substantially equal to that of the capacitor shown in FIG. 8. Thus, it is possible, according to the present invention, to form a capacitor having a large capacitance, improved reliability and a satisfactorily high dielectric strength even in a stepped region on a silicon substrate.

Embodiment 4

This embodiment employs a titanium nitride (TiN) film as the lower electrode of the capacitor, whereas the abovedescribed embodiments employ a silicon substrate or a polycrystalline film as the lower electrode of the capacitor.

Figure 10:
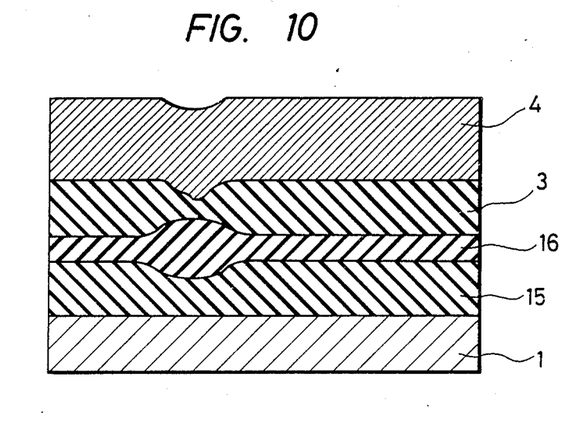
FIGS. 10 and 11 are a sectional view and a histogram, respectively, which are employed to describe still another embodiment of the present invention.
Figure 11:
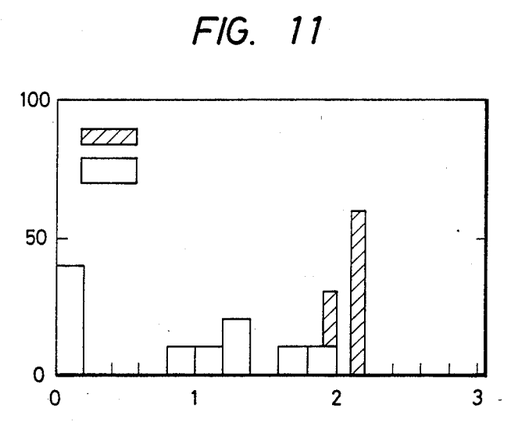

Referring to FIG. 10, the reference numeral 1 denotes a silicon substrate, 15 a TiN film defining a first electrode of the capacitor, 16 a titanium oxide film, 3 a tantalum oxide film, and 4 a tungsten film defining a second electrode of the capacitor. In this embodiment, a TiN film 15 having a thickness of 500 Å is first formed on the silicon substrate 1 by a known reactive sputtering method using an N$_2$-Ar gas mixture and Ti as a target. A tantalum oxide film 3 having a thickness of 100 Å is formed on the TiN film 15 by a known reactive sputtering method using an Ar-O$_2$ gas mixture and tantalum as a target. Thereafter, a heat treatment is carried out is a dry oxidizing atmosphere at 600° C. In consequence, a titanium oxide film 16 is grown at the interface between the tantalum oxide film 3 and the TiN film 15 serving as the first electrode. Then, a second (upper) electrode 4 constituted by a tungsten film is formed on the tantalum oxide film 3 to produce a capacitor. As shown in FIG. 10, the tantalum oxide film 3 has a thin region, and a portion of the titanium film 16 underneath the thin region is thicker than other portions thereof. Accordingly, this thin region constitutes no cause of deterioration of dielectric strength. If no oxidizing treatment were carried out, no thick titanium oxide film would be formed underneath the thin region, and this region would lead to deterioration of dielectric strength. FIG. 11 shows a histogram for comparison as to dielectric strength between a case where the above-described oxidizing treatment is carried out after the formation of the tantalum oxide film and a case where no oxidizing treatment is carried out. As will be clear from FIG. 11, the dielectric strength is greatly improved by carrying out the oxidizing treatment. Since the dielectric constant of titanium oxide is larger than that of SiO$_2$, if a titanium oxide film is employed as a part of the dielectric film of the capacitor, the degree to which the capacitance is lowered is so small that it can be ignored, and this is also greatly advantageous. It should be noted that the range of preferable heat treatment temperatures in the case of employing TiN is from 500 to 800° C. NbN or TaN may be employed as the lower electrode in place of TiN. In such case also, the dielectric strength and long-term stability of the capacitor can be considerably improved by carrying out a heat treatment in a dry oxidizing atmosphere at 500 to 800° C. after the formation of the tantalum oxide film. It is also possible to obtain excellent results by employing aluminum or an aluminum-based alloy (e.g., an aluminum-silicon alloy) as the lower electrode and carrying out the abovedescribed heat treatment at 300 to 500° C. In addition, it is possible to employ as the lower electrode of the capacitor various kinds of silicide, e.g., tantalum silicide, tungsten silicide, molybdenum silicide or titanium silicide. The range of preferable heat treatment temperatures in such case is substantially the same as that in the case of employing a single crystal silicon substrate or a polycrystalline silicon film, that is, from 600 to 1,000° C. Within this temperature range, it is possible to obtain excellent results. It is, as a matter of course, possible to employ as the upper electrode (second electrode) various kinds of material employed to form an electrode or wiring, such as A(, A(-based alloy (e.g., Al-Si alloy), polycrystalline silicon, W, Mo, W-silicide, Ta-silicide, Mo-silicide and Ti-silicide. The atmosphere in which the above-described heat treatment is carried out preferably has a water vapor content of about 1,000 ppm or less. When the water vapor content in the atmosphere is excessively high, a thick oxide film is undesirably formed also underneath portions other than a defect portion as described above, whereas, when the water vapor content is set at 1,000 ppm or less, favorable results can be obtained.

As will be clear from the above description, it is possible, according to the present invention, to considerably increase the capacitance of a capacitor without lowering the dielectric strength and long-term stability thereof. Accordingly, the present invention is extremely useful for improvement in packing density of semiconductor integrated circuits.

What is claimed is:

1. A semiconductor device including a capacitor having a first electrode made of an electrically conductive substance, a first dielectric film formed on said first electrode, said first dielectric film having first and second regions, the first regions being relatively thin and the second regions being relatively thick as compared to the thickness of the first regions, a second electrode made of an electrically conductive substance and formed on said first dielectric film, and a second dielectric film formed between said first electrode and said first dielectric film, said second dielectric film being made of an oxide of said electrically conductive substance constituting said first electrode, and portions of said second dielectric film which are underneath said first regions of said first dielectric film being thicker than other portions of said second dielectric film, underneath said second regions of said first dielectric film, said other portions of said second dielectric film, underneath said second regions of said first dielectric film, having a thickness of at most 40 Å.

2. A semiconductor device according to claim 1, wherein said first electrode is made of a substance selected from the group consisting of a single crystal silicon substrate, a polycrystalline silicon film, a silicide film, a titanium nitride film, an aluminum film and an aluminum-based alloy film.

3. A semiconductor device according to claim 2, wherein said silicide is selected from the group consisting of tungsten silicide, molybdenum silicide, titanium silicide and tantalum silicide.

4. A semiconductor device according to claim 1, wherein said first dielectric film is made of a material selected from the group consisting of tantalum oxide, titanium oxide, hafnium oxide, neodymium oxide and zirconium oxide.

5. A semiconductor device according to claim 1, wherein said second electrode is defined by a film made of a material selected from the group consisting of polycrystalline silicon, aluminum, aluminum-based alloy, tungsten, molybdenum, tungsten silicide, molybdenum silicide and titanium silicide.

6. A semiconductor device according to claim 1 which is a semiconductor memory having a MOS transistor and a capacitor.

7. A semiconductor device according to claim 6, wherein said semiconductor device includes a relatively thick insulator film for element isolation, wherein said MSO transistor includes a gate electrode, said gate electrode being spaced from said relatively thick insulator film, and wherein said capacitor is formed so as to extend laterally from an upper side of said gate electrode of said MOS transistor to an upper side of said relatively thick insulator film for element isolation.

8. A semiconductor device according to claim 1, wherein the first dielectric film is made of an oxide of a transition metal.

9. A semiconductor device according to claim 1, wherein the thickness of portions of said second dielectric film which are underneath said first regions of said first dielectric film is 40Å or more and is greater than the thickness of the other portions.

10. A semiconductor device according to claim 1, wherein the second dielectric film is a dielectric film formed by oxidation of the electrically conductive substance of the first electrode in a dry oxidizing atmosphere, after forming the first dielectric film on the first electrode.

11. A semiconductor device according to claim 10, wherein said dry oxidizing atmosphere is an atmosphere containing at most 1,000 ppm water vapor.

12. A semiconductor device according to claim 1, wherein the first electrode has a step portion and the first dielectric film is provided on the step portion, said first portions of said first dielectric film being provided at least on a side surface of said step portion.

13. A semiconductor device according to claim 1, wherein said first electrode is made of a substance selected from the group consisting of TiN, NbN and TaN.

14. A semiconductor device according to claim 1, wherein the first dielectric film is made of niobium oxide.

15. A semiconductor device including a capacitor having a first electrode made of an electrically conductive substance, a first dielectric film formed on said first electrode, said first dielectric film having first and second regions, the first regions being defect regions that are relatively thin and the second regions being relatively thick as compared to the thickness of the defect regions, a second electrode made of an electrically conductive substance and formed on said first dielectric film, and a second dielectric film formed between said first electrode and said first dielectric film, said second dielectric film being made of an oxide of said electrically conductive substance constituting said first electrode, and portions of said second dielectric film which are underneath said defect regions of said first dielectric film being thicker than other portions of said second dielectric film, underneath said second regions of said first dielectric film, said other portions of said second dielectric film, underneath said second regions of said first dielectric film, having a thickness of at most 40 angstroms, whereby the total thickness of the dielectric films at the defect regions is increased so that lowering of the dielectric strength due to the defect regions is avoided, while avoiding decreased capacitance by providing relatively thin other portions of the second dielectric film underneath the relatively thick second regions of the first dielectric film.

16. A semiconductor device according to claim 15, wherein said first electrode is made of a substance selected from the group consisting of a single crystal silicon substrate, a polycrystalline silicon film, a silicide film, a titanium nitride film, a niobium nitride film, a tantalum nitride film, an aluminum film and an aluminum-based alloy film.

17. A semiconductor device according to claim 16, wherein the first dielectric film is made of a material selected from the group consisting of tantalum oxide, titanium oxide, hafnium oxide, neodymium oxide, niobium oxide and zirconium oxide.

18. A semiconductor device according to claim 15, wherein the first dielectric film is made of a material selected from the group consisting of tantalum oxide, titanium oxide, hafnium oxide, neodymium oxide, niobium oxide and zirconium oxide.

* * * * *